US 9,806,743 B2

United States Patent
Koike-Akino et al.

(10) Patent No.: US 9,806,743 B2
(45) Date of Patent: Oct. 31, 2017

(54) SYSTEM AND METHOD OF BELIEF PROPAGATION DECODING

(71) Applicant: Mitsubishi Electric Research Laboratories, Inc., Cambridge, MA (US)

(72) Inventors: Toshiaki Koike-Akino, Saugus, MA (US); David Millar, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 165 days.

(21) Appl. No.: 14/941,789

(22) Filed: Nov. 16, 2015

(65) Prior Publication Data
US 2017/0141796 A1    May 18, 2017

(51) Int. Cl.
*H03M 13/11*        (2006.01)
*H04L 1/00*        (2006.01)
(Continued)

(52) U.S. Cl.
CPC ........ *H03M 13/1111* (2013.01); *H03M 13/01* (2013.01); *H03M 13/033* (2013.01);
(Continued)

(58) Field of Classification Search
CPC ............... H03M 13/01; H03M 13/033; H03M 13/1111; H03M 13/1117; H03M 13/114;
(Continued)

(56) References Cited

U.S. PATENT DOCUMENTS 7,447,985 B2    11/2008    Tran et al.
7,552,379 B2    6/2009    Concil et al.
(Continued)

FOREIGN PATENT DOCUMENTS

EP    1601108 A1    11/2005
EP    2083519 A2    7/2009
EP    2892157    7/2015

OTHER PUBLICATIONS

Balatsoukas Stimming Alexios et al. "A Fully unrolled LDPC Decoder based on Quantized message passing," Proc. IEEE Workshop on Signal Processing Systems, Oct. 14, 2015, p. 1-6.
(Continued)

*Primary Examiner* — John J Tabone, Jr.
(74) *Attorney, Agent, or Firm* — Gene Vinokur; James McAleenan; Hironori Tsukamoto

(57) ABSTRACT

A method for decoding a codeword transmitted over a channel demodulates data received over the channel to produce an initial estimate of belief messages for bits of the codeword and decodes the codeword using a belief propagation (BP) decoding that iteratively passes the belief messages between a set of variable nodes representing the bits of the codeword and a set of check nodes representing parity-check constraints on the bits of the codeword until a termination condition is met. The BP decoding selects a look-up table based on a probability of the belief messages and maps, using the look-up table, values of at least two incoming belief messages to values of at least one outgoing belief message that forms an incoming belief message in a subsequent iteration of the BP decoding.

18 Claims, 9 Drawing Sheets

(51) Int. Cl.
*H03M 13/01* (2006.01)
*H03M 13/03* (2006.01)
*H03M 13/00* (2006.01)
*H03M 7/00* (2006.01)

(52) U.S. Cl.
CPC ...... *H03M 13/114* (2013.01); *H03M 13/1117* (2013.01); *H03M 13/1154* (2013.01); *H03M 13/1171* (2013.01); *H03M 13/1174* (2013.01); *H03M 13/6577* (2013.01); *H03M 13/6588* (2013.01); *H03M 13/6594* (2013.01); *H04L 1/0045* (2013.01); *H03M 7/00* (2013.01)

(58) Field of Classification Search
CPC ......... H03M 13/1154; H03M 13/1171; H03M 13/1174; H03M 13/6577; H03M 13/6588; H03M 13/6594; H03M 7/00; H04L 1/0045
USPC ................................ 714/759, 751, 752, 774
See application file for complete search history.

(56) References Cited

U.S. PATENT DOCUMENTS

| | | | |
|---|---|---|---|
| 8,458,556 B2 | 6/2013 | Planjery et al. | |
| 9,215,457 B2* | 12/2015 | Koike-Akino | H03M 13/373 |
| 2005/0081128 A1* | 4/2005 | Jones | H03M 13/1114 714/700 |
| 2007/0157066 A1 | 7/2007 | Concil et al. | |
| 2007/0217541 A1* | 9/2007 | Liu | H03M 7/30 375/279 |
| 2010/0169735 A1* | 7/2010 | Biscondi | H03M 13/1117 714/752 |
| 2011/0087946 A1 | 4/2011 | Planjery et al. | |
| 2011/0246136 A1* | 10/2011 | Haratsch | H03M 13/612 702/181 |
| 2011/0246842 A1* | 10/2011 | Haratsch | G11C 11/5642 714/722 |
| 2011/0246859 A1* | 10/2011 | Haratsch | G11C 7/04 714/773 |
| 2013/0308700 A1* | 11/2013 | Koike-Akino | H03M 13/373 375/240.07 |

OTHER PUBLICATIONS

Meidlinger Michael et al. "Quantized message passing for LDPC codes," IEEE 49th Asilomar conference on signals, Systems and computers, Nov. 8, 2015, pp. 1606-1610.

Spagnol et al, "Hardware implementation of GF (2m) LDPC decoders," IEEE Transactions on circuits and systems I. Regular Papers, IEEE vol. 56, No. 12. Dec. 1, 2009. pp. 2609-2620.

Lentmaier et al. "On the thresholds of generalized LDPC convolutional codes based on protographs," IEEE International Symposium on Information Theory, Jun. 13, 2010. pp. 709-713.

* cited by examiner

SYSTEM AND METHOD OF BELIEF PROPAGATION DECODING

FIELD OF THE INVENTION

This invention is related to telecommunication technologies, particularly for belief propagation decoding for digital data transmissions in radio and optical communications systems.

BACKGROUND OF THE INVENTION

In a number of telecommunication applications including radio and optical communications, forward-error correction (FEC) codes, such as low-density parity-check (LDPC) codes, have been used to realize reliable data communications under noisy channels. In particular, LDPC codes have achieved excellent performance near the theoretical Shannon limit in practice. FEC codes are decoded with various implementations of belief propagation (BP) decoding methods. For example, different variants of sum-product methods (SP), e.g., a min-sum (MS) method, a delta-min (DM) method, a modified min-sum (MMS) method, and a shifted min-sum (SMS) method, use the framework of the BP decoding. The BP decoding uses an iterative message-passing to propagate soft-decision belief messages over a Tanner graph for correcting potential errors occurred during the data communications over noisy channels.

Most FEC codes are characterized by a parity-check matrix (PCM) H containing some nonzero entries, which come from the Galois field of $GF(2^q)$, where q is a positive integer called field order. These FEC codes can be represented by a bipartite graph called Tanner graph, which is more useful representations when carrying out the iterative decoding process. The Tanner graph representation of an LDPC code includes two sets of nodes and edges connecting these nodes. One set of nodes is called variable nodes, representing the bits associated with a codeword. The other set of nodes is called check nodes, representing parity-check constraints on the bits of the codeword. An edge of the graph connects a variable node to a check node only if that particular bit represented by the variable node participates in the parity-check equation represented by the check node. Since PCM for LDPC codes has a small number of nonzero entries, the Tanner graph becomes a sparse graph having a few number of edges. The sparse Tanner graph can provide the possibility of computationally efficient BP decoding.

Different BP decoders iteratively pass the received codewords on the Tanner graph to decode the transmitted codewords. The message passing operations at check nodes require nonlinear functions for the original SP method. There are many versions, such as MS method for the BP decoder, that use message-passing approach to simplify the decoding operations for low-power hardware implementation. In addition, most practical decoder implementations need quantized versions of BP decoding for finite-precision processors, which use a fixed number of bits to represent the belief messages.

A message-passing method can be described by defining an update rule at the variable nodes and an update rule at the check nodes. The variable node update rule and the check node update rule can be denoted as functions used to determine the outgoing messages. For example, initially, all belief messages are set to zero and the variable node receives only the channel likelihood value. The variable node sends this channel likelihood value as its outgoing belief message to all its neighboring check nodes in the first iteration. At the check nodes, the check node update rule is used to determine the outgoing belief messages, and the outgoing belief messages are passed to the variable nodes. At the variable node, the variable node update rule is used to determine the outgoing belief messages, and in this manner messages are iteratively passed between variable nodes and the check nodes until a termination condition is met, e.g., a predefined maximum number of iterations.

Most BP decoders are implemented in the "log-likelihood domain," and the computation of the update rule requires computation of logarithmic functions. To simplify the computations for finite-precision processors, some quantized BP decoders use look-up tables (LUT) to pre-compute the closest-possible results of such logarithmic functions, see e.g., U.S. Pat. No. 8,458,556, U.S. Pat. No. 7,552,379, and U.S. Pat. No. 7,447,985.

Although the LUT implementations are computationally efficient, the number of quantization levels needs to be sufficiently large in order to keep the degradation due to quantization negligible compared to idealistic floating-point processing. In addition, the bit widths of the LUT output needs to be increased in cascaded structure to obtain intermediate data, and to be truncated when iterating the BP processing. Moreover, the LUT does not work well for different signal-to-noise ratio (SNR) because of the dynamic range of input LLR varies. Accordingly, there is a need to improve both the efficiency and accuracy of LUT implementations for quantized BP decoders.

SUMMARY OF THE INVENTION

Some embodiments of the invention are based on recognition that belief messages used by the belief propagation (BP) decoder come from a specific probability distribution which is nonuniform and varies across decoding iteration. To that end, it is recognized that a single look-up table (LUT) does not represent different varieties of the statistics of the belief messages and thus suboptimal.

Some embodiments are based on realization that a plurality of LUTs can be adaptively used by the BP decoder to select the LUT optimized for the current statistic of the belief messages. For example, the statistic can vary for one or combination of different iterations of the BP decoding, different stages of the BP decoding, different values of a signal-to-noise ratio (SNR) of belief messages, values of Galois field, scheduling of the propagation of the belief messages, quantization level, and other factors.

In some embodiments, the statistic includes a probability of the belief messages. For example, in the embodiment for the quantized BP decoding, the probability is a probability mass function (PMF) that gives the probability of occurrence of the quantized values of belief messages conditioned on the bits of the codeword. In another embodiment, the probability is a probability density function (PDF) for the case when the quantization level for belief messages is sufficiently large to represent any real numbers without practical approximation errors.

One embodiment of the invention determines the LUTs such that mutual information (MI) of the belief messages is maximized depending on the probability mass function of the belief messages. The embodiment is based on recognition that methods approximating update rules at variable nodes and check nodes in finite-precision BP decoding do not always provide the best performance because due to differences in the probabilities of belief messages across the decoding iteration. To that end, in some embodiments, the LUTs are determined and selected adaptively to increase the mutual information of the belief messages having different probabilities.

In some embodiments, the LDPC encoder and LUT decoder are jointly optimized to enhance the error correction capability. This is based on recognition that the MI at the decoder depends on the degree distribution of LDPC encoder and LUT adaptation of decoder. Hence, the degree distribution of LDPC encoder is re-designed such that the decoding performance of LUT decoder is increased once the decoder adaptively selects the best set of LUTs. In yet another embodiment, the LUT is jointly optimized together with decoding scheduling. For example, layered scheduling and shuffled scheduling as well as flooding scheduling are optimized to enhance the decoding convergence speed of LUT-based decoder.

To that end, in some embodiments, the look-up tables are adaptively selected such that mutual information of belief messages is increased based on a recognition that the probability of the belief messages varies over decoding iteration, channel signal-to-noise ratio, modulation format, decoding scheduling, quantization level, and degree distribution.

Accordingly, one embodiment discloses a method for decoding a codeword transmitted over a channel. The method includes demodulating data received over the channel to produce an initial estimate of belief messages for bits of the codeword; and decoding the codeword using a belief propagation (BP) decoding that iteratively passes the belief messages between a set of variable nodes representing the bits of the codeword and a set of check nodes representing parity-check constraints on the bits of the codeword until a termination condition is met. The BP decoding includes determining a probability of the belief messages; selecting a look-up table (LUT) from a set of LUTs based on the probability; and mapping, using the LUT, values of at least two incoming belief messages to values of at least one outgoing belief message that forms an incoming belief message in a subsequent iteration of the BP decoding. At least some steps of the method are performed by a processor of the BP decoder.

Another embodiment discloses a system for decoding a codeword transmitted over a channel including a demodulator to demodulate data received over the channel and to produce an initial estimate of belief messages for bits of the codeword; a memory to store a set of look-up tables (LUTs) determined for different probabilities of the belief messages; and a belief propagation (BP) decoder to decode the codeword by iteratively passing the belief messages between a set of variable nodes representing the bits of the codeword and a set of check nodes representing parity-check constraints on the bits of the codeword until a termination condition is met. The BP decoder determines a probability of the belief messages to represent the bits of the codeword; selects, based on the probability, a LUT from the set of LUTs stored in the memory; and maps, using the LUT, values of at least two incoming belief messages to values of at least one outgoing belief message that forms an incoming belief message in a subsequent iteration of the BP decoder.

DETAILED DESCRIPTION OF THE PREFERRED EMBODIMENTS

Figure 1:
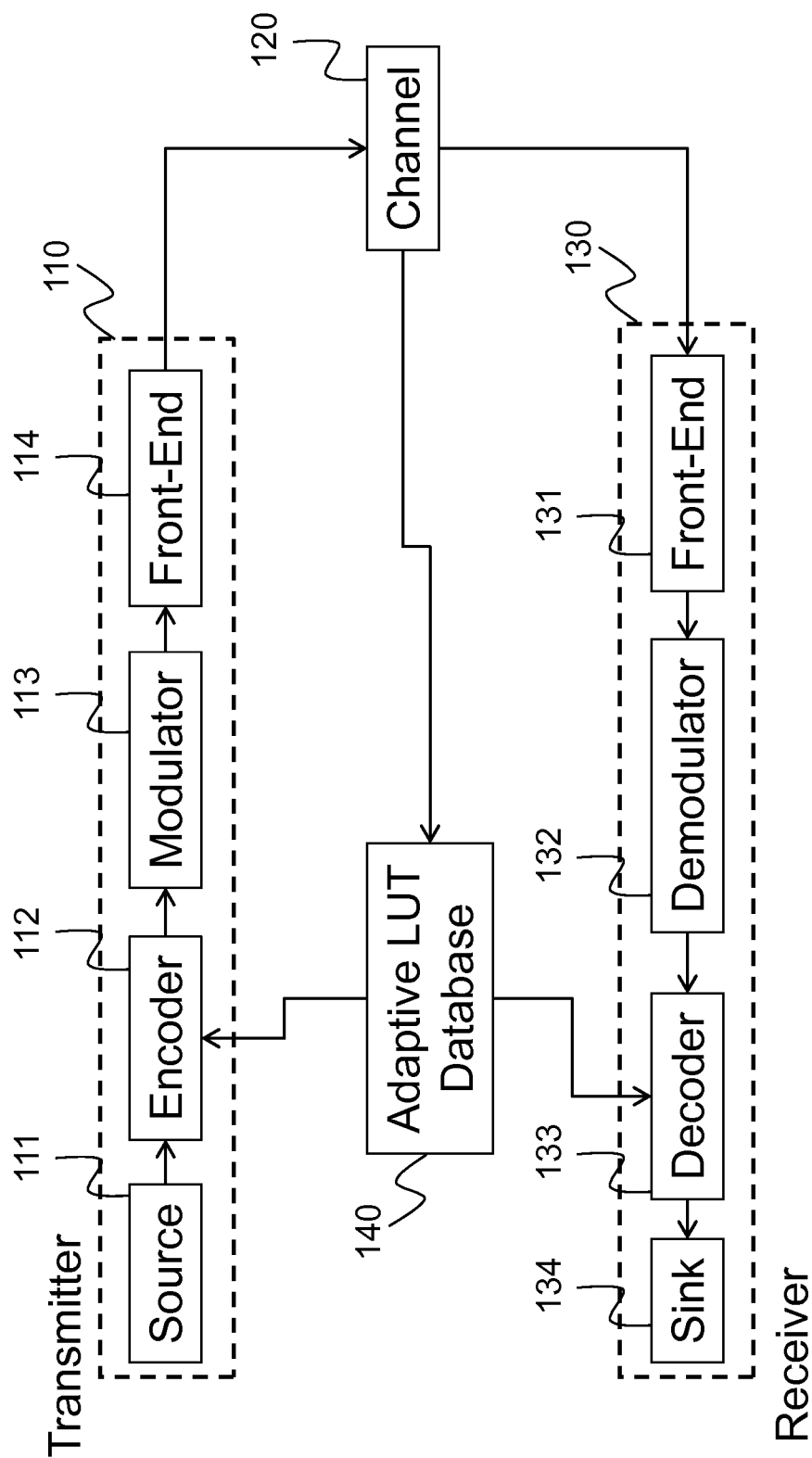
FIG. 1 is a schematic of communications systems transmitting data from a transmitter to a receiver over a channel according to embodiments of the invention.

FIG. 1 shows a communications system for transmissions of digital data from a transmitter 110 to a receiver 130 over a channel 120 according to some embodiments of the invention. For example, the communication channel 120 includes air medium for radio communications, cupper cable of wired communications, and fiber cable for fiber-optic communications. During the communications, the digital data can be corrupted by noise of the channel. The transmitter 110 uses a forward-error correction (FEC) code such as low-density parity-check (LDPC) codes to realize reliable data transmissions. The receiver tries to recover the data by using an iterative belief-propagation (BP) decoder.

At the transmitter 110, the original data to be sent come from a source 111. The source data include codewords that are first encoded by an FEC encoder 112. The encoded data are modulated by a modulator 113. The modulator uses various digital modulation formats such as quadrature-amplitude modulation (QAM). The modulated data are transmitted into the channel via front-end circuits 114, which can include electro-optic devices for optical communications and radio-frequency devices for radio communications. The front-end can also include signal pre-processing such as band-pass filter, precoding, power loading, pilot insertion, and pre-distortion.

The channel 120 distorts the transmitted signal. For example, the channel adds additive white Gaussian noise (AWGN), co-channel interference (CCI), deep fading, impulsive noise, inter-symbol interference (ISI), nonlinear interference (NLI) due to Kerr effect, and linear chromatic dispersion (CD).

The receiver 130 first converts the channel output into electrical received signals via front-end circuits 131, which are typically complementary of the front-end 114 at the transmitter. For example, the front-end includes linear equalization, nonlinear equalization, adaptive filtering, channel estimation, carrier phase recovery, synchronization, and polarization recovery. The received signals are demodulated at a demodulator 132 to produce an initial estimate of belief messages for bits of the transmitted codeword. For example, in one embodiment, the demodulator 132 calculates log-likelihood ratio (LLR) data. The LLR data are used to decode for recovering the source data at an FEC decoder 133. In various embodiments, the decoder 133 is a belief propagation (BP) decoder. The decoded data are finally sent to a data sink 134.

Some embodiments of the invention are based on recognition that belief messages used by the BP decoder come from a specific probability distribution, which is not uniform and varies over decoding process. Therefore, a single look-up table (LUT) does not represent different varieties of the statistics of the belief messages and thus suboptimal. To that end, some embodiments of the invention use a set of look-up tables (LUTs) 140 determined for different probabilities of the belief messages. Those LUTs are determined and selected adaptively to increase mutual information of belief messages based on their probabilities.

The transmitted codewords encoded with LDPC codes can be decoded with various implementations of BP decoding methods. For example, BP decoding includes sum-product method (SP), min-sum (MS), offset min-sum (OMS), modified min-sum (MMS), and delta-min (DM) methods. Different methods have different update rules for iterative BP decoding. The LDPC codes can be represented by Tanner graphs for carrying out the iterative decoding process. The Tanner graph includes two sets of nodes, i.e., variable nodes to represent bits of the codeword and check nodes to represent parity-check constraints on the bits of the codeword. An edge of the graph connects a variable node to a check node only if that particular bit represented by the variable node participates in the parity check equation represented by the check node. The number of edges connecting to variable nodes and check nodes is referred to as variable degree and check degree, respectively. The error-correction performance of LDPC codes depends on the distribution of variable and check degrees in general. LDPC codes are specified by a parity-check matrix (PCM), whose non-zero elements come from a finite set of Galois field. In particular for LDPC codes, the PCM is sparse, i.e., the number of nonzero elements is small, and thus the Tanner graph is also sparse, i.e., there is relatively small number of edges. The sparse Tanner graph can lead to computationally efficient BP decoding since the number of belief messages propagated over BP decoding is equal to the total number of edges in the Tanner graph.

Figure 2A:
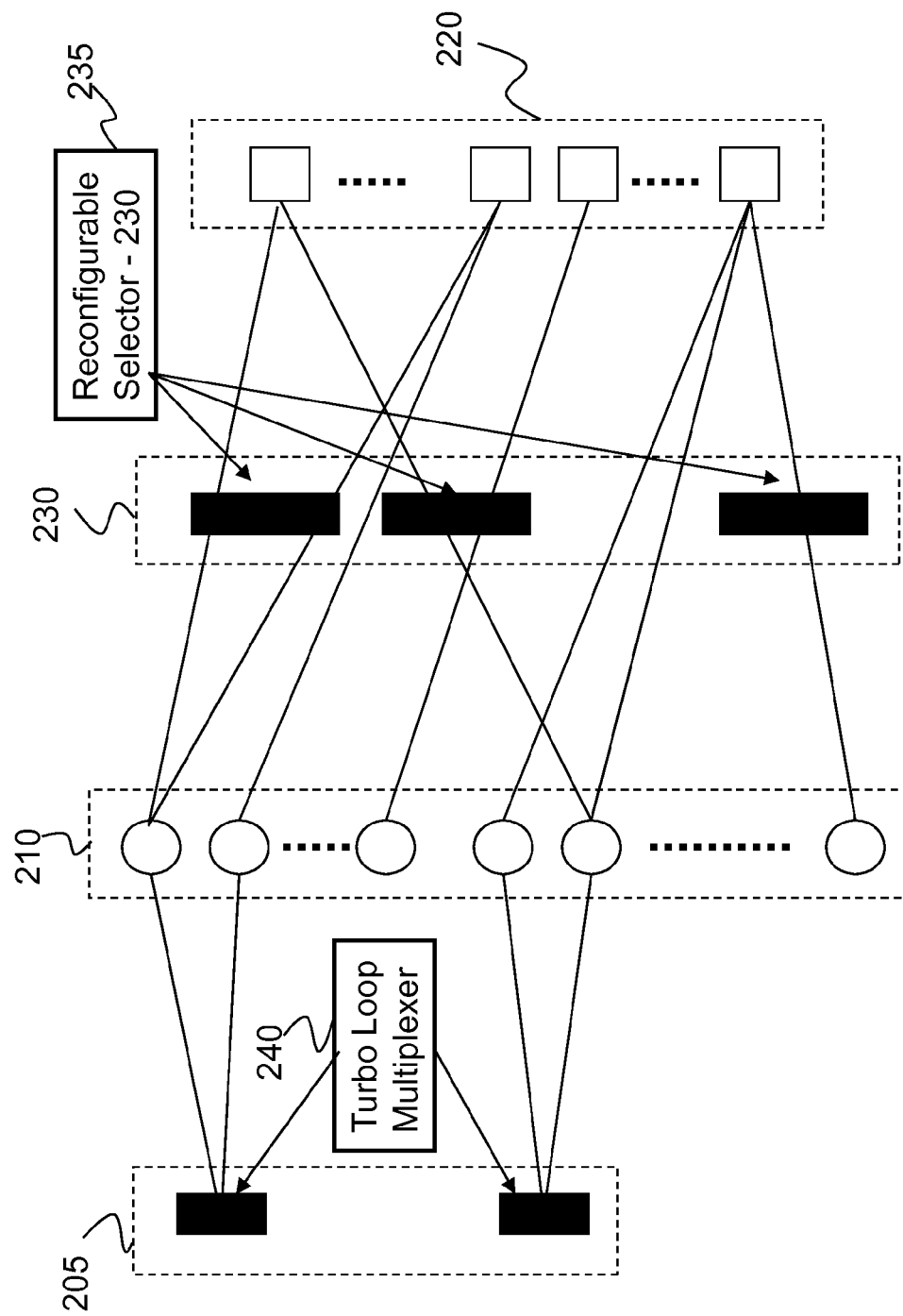
FIG. 2A is a schematic of flexible belief propagation decoding in a bipartite graph representation of linear codes between variable nodes and check nodes according to some embodiments of the invention.

FIG. 2A shows the BP decoding over the Tanner graph representation of codes according to one embodiment of the invention. The BP decoding propagates belief messages between variable-node decoders (VND) 210 and check-node decoders (CND) 220. The BP decoder iteratively passes the belief messages on the Tanner graph to decode the transmitted codewords. A message-passing method can be described by defining an update rule at the VNDs and an update rule at the CNDs. The update rule at the VNDs and the update rule at the CNDs can be denoted as functions used to determine the outgoing messages. At the CNDs, the update rule is used to determine the outgoing messages and the messages are passed to the VNDs. At the VNDs, the update rule is used to determine the outgoing messages, and in this manner messages are iteratively passed between VNDs and CNDs until a termination condition is met. For example, the termination condition is the pre-defined maximum number of iterations or syndrome check passing.

In some embodiments, the message updates are done at all VNDs in parallel, and then the updated messages are processed at all CNDs in parallel. This method of update scheduling is called flooding scheduling. In some embodiments, the scheduling is layered, where CNDs are split into multiple layers, and the CND updates are done at once for each layer before VND updates. This layered scheduling can reduce the required number of VNDs and CNDs for parallel implementations, leading to smaller circuit size of the decoder. In addition, the layered scheduling can improve the decoding convergence speed. In one embodiment, the scheduling is adaptively designed so that the mutual information (MI) is maximized at the final iteration according to adaptive LUT.

The computation of the update rule for BP decoding based on SP can require computation of logarithmic functions. To simplify the computations, some BP decoders use look-up tables (LUT) to pre-compute the quantized results of such logarithmic functions. The LUT implementations are computationally efficient when the number of quantization level is small, whereas the low-level quantization used for determining the LUT can degrade the accuracy of the decoding. Some embodiments of the invention improve both the efficiency and accuracy of the BP decoders by using adaptive LUTs that varies according to the probability of the belief messages propagated in the Tanner graph.

In one embodiment of the invention, the FEC encoder 112 can also be adaptively changed by information of LUTs 140. For this embodiment, the LDPC decoder 133 is implemented by a flexible Tanner graph to accommodate different LDPC codes. When the LDPC encoder uses different degree PCMs, the Tanner graph can be changed accordingly. An edge interleaver 230 can change the Tanner graph by routing the belief messages between VNDs and CNDs according to the PCM used at the transmitter. The edge interleaver 230 can include reconfigurable selector 235 for adaptively routing the belief messages between intended VNDs and CNDs.

One embodiment of the invention uses turbo iterative demodulation, where the demodulator 132 receives intermediate belief messages from the FEC decoder 133 so that the LLR data are updated to be more reliable. In this embodiment, the LLR 205 from the demodulator is selected by a turbo loop multiplexer 240, which switch initial LLR data from the demodulator or updated LLR data from the demodulator after turbo iteration.

In some embodiments of the invention, the FEC decoder uses a finite-precision BP decoding, i.e., all the belief messages are quantized, and the quantized messages are processed by adaptive lookup table (LUT), without using any arithmetic operations. In one embodiment, the number of inputs for LUT is all two ports, and the quantization levels are kept constant. The adaptive LUT changes update rules at VNDs and CNDs depending on one or combination of the iteration count, cascaded stage, signal-to-noise ratio (SNR), Galois field size, modulation formats, degree distribution, quantization level, and scheduling.

Adaptive LUT-Based BP Decoding Using Probability of Belief Messages

Figure 2B:
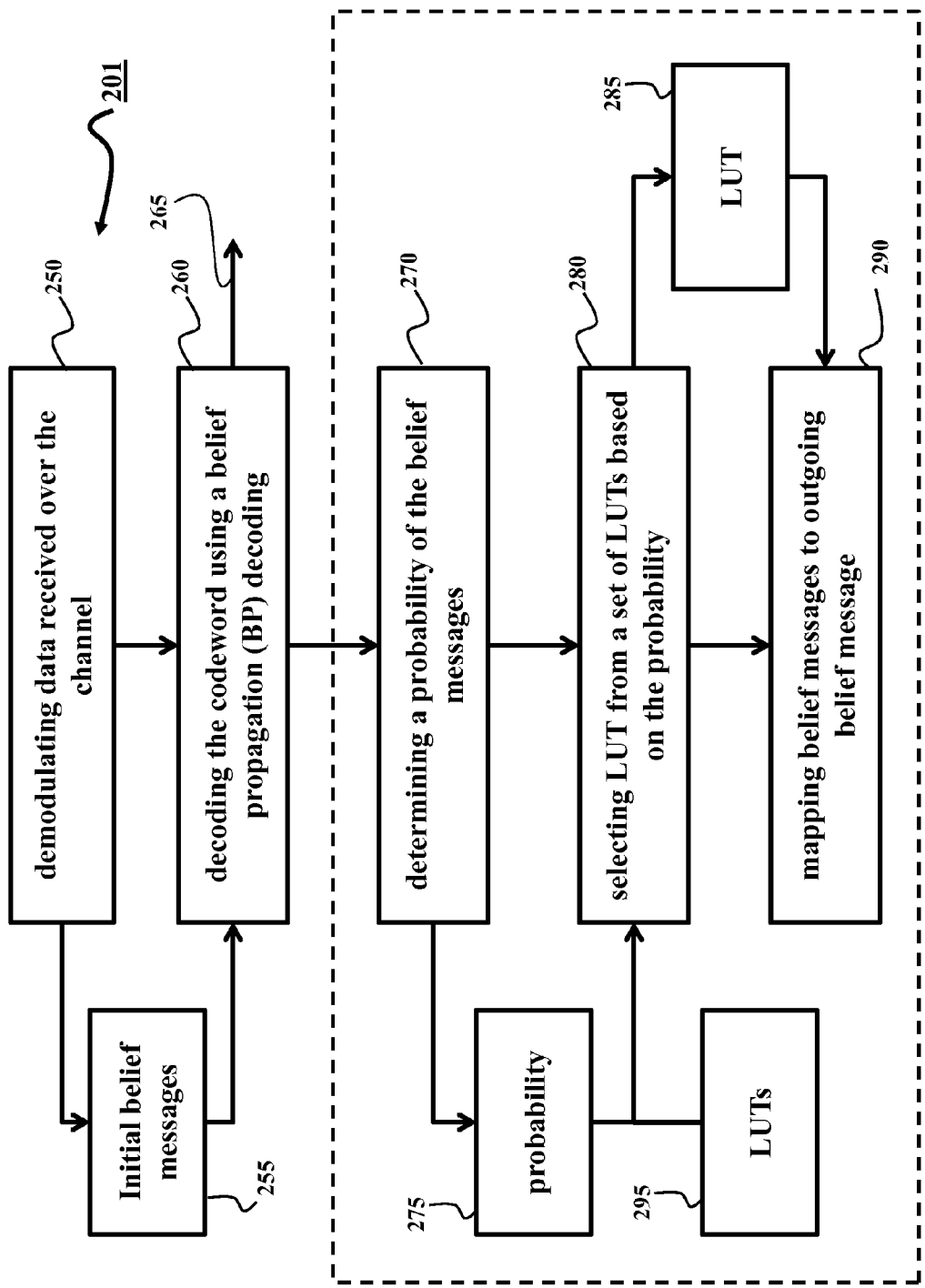
FIG. 2B is a block diagram of a method for decoding a codeword transmitted over a channel according to one embodiment of the invention.

FIG. 2B shows a block diagram of a method for decoding a codeword transmitted over a channel according to one embodiment of the invention. In this embodiment, a set of LUTs can be adaptively used by the BP decoder to select the LUT optimized for the current statistic of the belief messages. At least some steps of the method are performed by a processor of the BP decoder.

The method demodulates 250 data received over the channel to produce an initial estimate 255 of belief messages for bits of the codeword. For example, the initial estimate can be LLR of the data or any other statistic of the channel 120. Next, the method decodes 260 codeword using a belief propagation (BP). The BP decoding 260 outputs the decoded codeword 265.

In turn, the BP decoding 260 determines 270 a probability 275 of the belief messages and selects 280 a look-up table (LUT) 285 from a set of LUTs 295 based on the probability 275. The BP decoding uses the LUT 285 to map 290 values of incoming belief messages to values of outgoing belief messages. The outgoing belief message forms an incoming belief message in a subsequent iteration of the BP decoding.

In some embodiments, the BP decoder is a quantized decoder. For example, values of the belief messages are quantized and each LUT maps the quantized values of the two incoming belief messages to the quantized values of the outgoing belief messages according to a quantized function of the incoming belief messages modified based on the probability. The probability can be, e.g., a probability mass function (PMF) that gives the probability of occurrence of the quantized values of belief messages conditioned on the bits of the codeword.

In some embodiments, the LUTs are determined to increase mutual information of the belief messages. For example, for the quantized BP decoder, the set of LUTs are determined for a set of different PMFs, such that each LUT maximizes mutual information (MI) of the outgoing belief messages with values having a probability governed by the corresponding PMF.

For example, the update rules at degree-2 VNDs and degree-3 CNDs for SP decoding are as follows:

$$L_0 = L_1 + L_2,$$

$$L_0 = 2\operatorname{arctanh}\left(\tanh\left(\frac{L_1}{2}\right) \times \tanh\left(\frac{L_2}{2}\right)\right),$$

where $L_0$, $L_1$ and $L_2$ are outgoing belief message, the first incoming belief message, and the second incoming belief message, respectively. One of the incoming messages for VNDs is the initial LLR data from the demodulator. Higher-degree decoders can be computed by cascading degree-2 VNDs or degree-3 CNDs. Hyperbolic functions, arctanh(x) and tanh(x), involve exponential function, exp(x), and logarithmic function, log(x), as arctanh $$(x) = \frac{1}{2}\log\left(\frac{1+x}{1-x}\right)$$

and tanh $$(x) = \frac{1 - \exp(-2x)}{1 + \exp(-2x)}.$$

To avoid those nonlinear functions, some decoders such as MS methods use simplified update rules for CNDs. However, those simplification methods degrade performance significantly and the LUT-based BP decoders approximate the original CND updates by using LUT, which pre-computes the results, instead of involving complicated arithmetic computations.

Figure 3A:
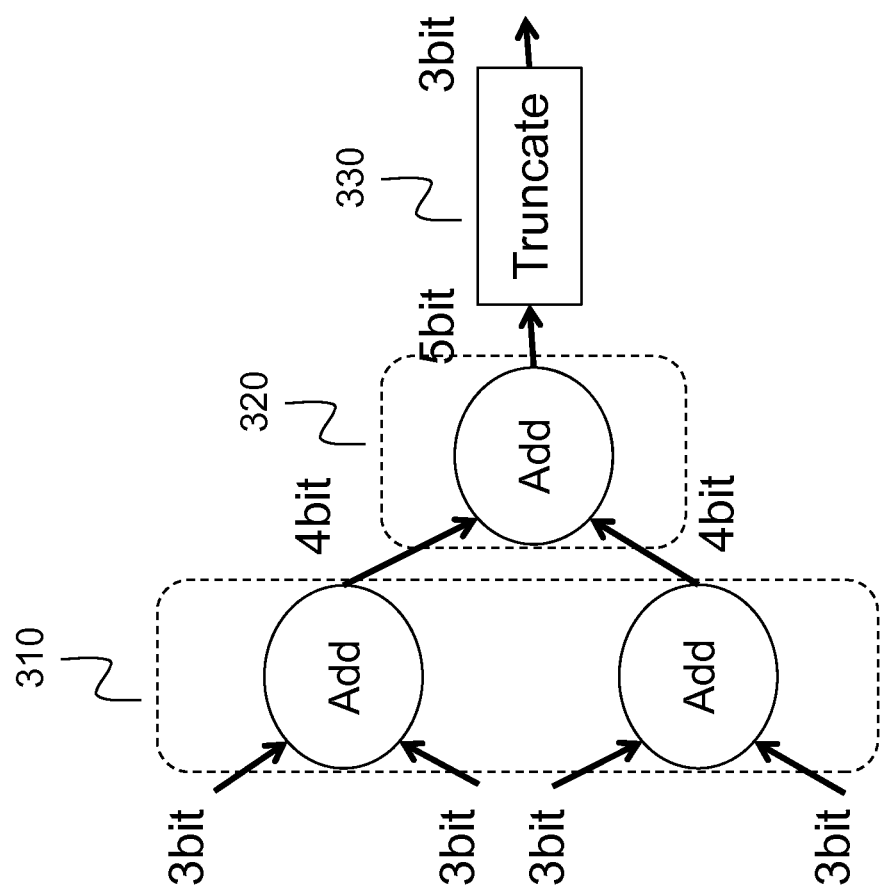
FIG. 3A is a schematic of cascaded structure of variable node decoders for conventional sum-product method.

FIG. 3A shows an example of conventional degree-4 VND, which uses arithmetic additions for the update rules. In this example, to sum four belief messages for degree-4 VNDs, 2-stage cascade decoder is used. The first stage adders 310 increase the bit width for the result of additions, e.g., from 3-bit precision to 4-bit precision so that no rounding error occurs. The second stage adder 320 increases the bit width to 5-bit precision. In the end, the bit width is truncated 330 to 3-bits. The conventional VNDs are not efficient because intermediate belief messages across cascade stages requires more bits for precision although the outgoing belief messages need to be truncated to a pre-defined finite precision.

Figure 3B:
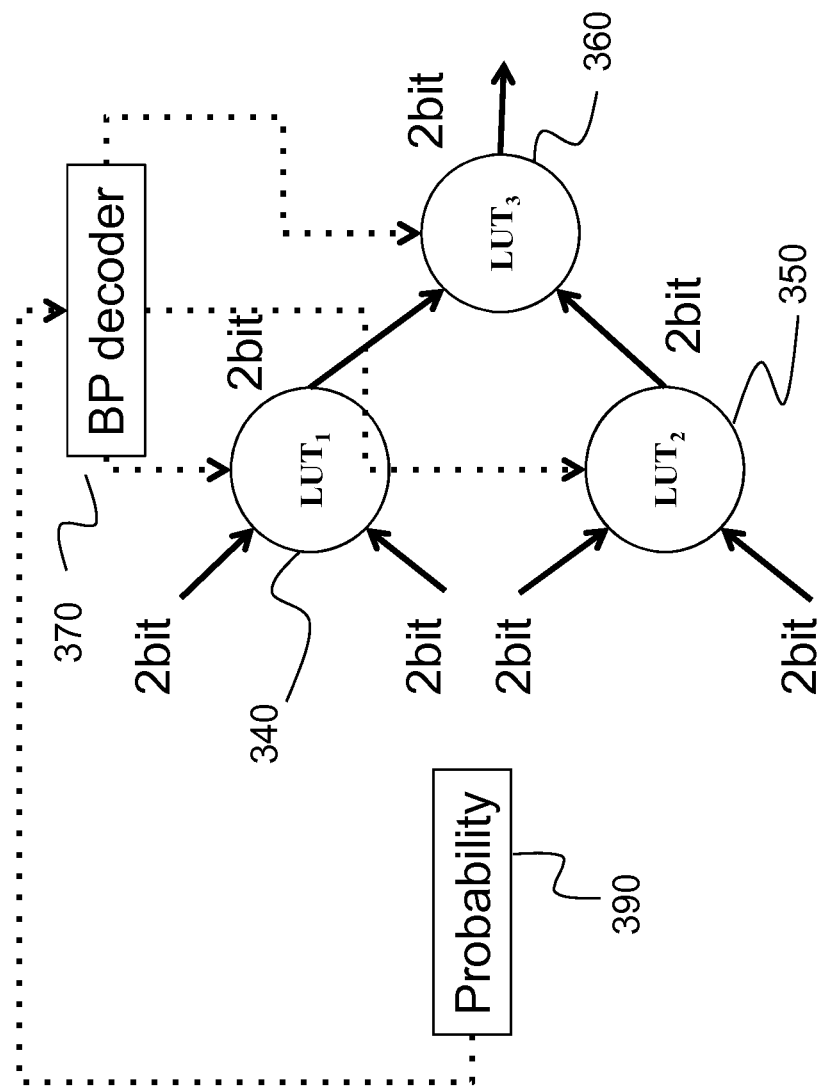
FIG. 3B is a schematic of cascaded structure of variable and check node decoders using adaptive lookup table according to some embodiments of the invention.

FIG. 3B shows an example of cascaded BP decoder according to one embodiment of the invention. In this embodiment, the bit width is constant over all stages. For example, the LUT with 2-bit precision can reduce the circuit size to about 30% compared to the conventional structure. The computational complexity can be further reduced for higher-degree VNDs, which need more cascade stages. In addition, the LUT selection is adaptively controlled by the BP decoder 350, depending on various factors including the iteration count, the cascade stage, and the SNR value. Those factors can change the probability 390 of incoming belief messages, and the BP decoder uses the statistical information of the probability 390 to adaptively select the best LUTs. For example, the $LUT_1$ 340 and $LUT_2$ 350 at the first stage are different from the $LUT_3$ 360 at the second stage. In addition, the LUT changes according to the SNR value. This is based on a recognition that the fixed finite-precision LUT can suffer from a dynamic range loss when the LLR values become too large at high SNR regimes or too small at low SNR regimes. In a similar manner, the belief messages are updated to have higher amplitude likewise high SNR regimes across the decoding iteration counts.

The BP decoder 370 adaptively selects the best update rules from the LUTs 140, for each LUT of cascade stages over different iterations and SNRs. The LUT is designed so that the MI is maximized, rather than approximation error from idealistic adders is minimized.

The conventional LUT is designed to provide outgoing messages as close to the output of idealistic SP decoding as possible within available precision of quantization level. For example, the belief messages are quantized into 4 levels; −2A, −A, 0, and A, i.e., 2-bit fixed-point precision scaled by a factor of A. The scale factor can be selected such that the approximation error is minimized. Supposing A=0.5, the pre-computed CND output for SPA decoding is given as follows:

| SPA CND | $L_1 = -2A$ | $L_1 = -A$ | $L_1 = 0$ | $L_1 = A$ |
| --- | --- | --- | --- | --- |
| $L_2 = -2A$ | 0.87A | 0.45A | 0 | −0.45A |
| $L_2 = -A$ | 0.45A | 0.24A | 0 | −0.24A |
| $L_2 = 0$ | 0 | 0 | 0 | 0 |
| $L_2 = A$ | −0.45A | −0.24A | 0 | 0.24A |

If the outgoing message is also quantized by the same 4 levels (−2A, −A, 0, and A), the LUT to approximate the SPA by rounding becomes as follows:

| LUT CND | $L_1 = -2A$ | $L_1 = -A$ | $L_1 = 0$ | $L_1 = A$ |
| --- | --- | --- | --- | --- |
| $L_2 = -2A$ | A | 0 | 0 | 0 |
| $L_2 = -A$ | 0 | 0 | 0 | 0 |

-continued

| LUT CND | $L_1 = -2A$ | $L_1 = -A$ | $L_1 = 0$ | $L_1 = A$ |
|---|---|---|---|---|
| $L_2 = 0$ | 0 | 0 | 0 | 0 |
| $L_2 = A$ | 0 | 0 | 0 | 0 |

This LUT has a maximum approximation error of 0.45A, e.g., at $L_1=-2A$ and $L_2=A$. This approximation error can be decreased by optimizing the 4-level quantization points or increasing the quantization level with higher precision. However, increasing the quantization level requires larger circuits for decoder implementation because the size of LUT rapidly increases with respect to the quantization level.

In an analogous manner, the pre-computed VND output for SPA decoding (which is just an arithmetic addition) and its approximated LUT are respectively as follows:

| SPA VND | $L_1 = -2A$ | $L_1 = -A$ | $L_1 = 0$ | $L_1 = A$ |
|---|---|---|---|---|
| $L_2 = -2A$ | $-4A$ | $-3A$ | $-2A$ | $-A$ |
| $L_2 = -A$ | $-3A$ | $-2A$ | $-A$ | 0 |
| $L_2 = 0$ | $-2A$ | $-A$ | 0 | A |
| $L_2 = A$ | $-A$ | 0 | A | $2A$ | and

| LUT VND | $L_1 = -2A$ | $L_1 = -A$ | $L_1 = 0$ | $L_1 = A$ |
|---|---|---|---|---|
| $L_2 = -2A$ | $-2A$ | $-2A$ | $-2A$ | $-A$ |
| $L_2 = -A$ | $-2A$ | $-2A$ | $-A$ | 0 |
| $L_2 = 0$ | $-2A$ | $-A$ | 0 | A |
| $L_2 = A$ | $-A$ | 0 | A | A |

With this LUT, the approximation error is 2A at maximum when incoming messages are $L_1=-2A$ and $L_2=-2A$. This error can be decreased by designing the 4-level quantization points or increasing the quantization level for incoming messages and outgoing messages. However, the conventional LUT design method is not always efficient because smallest possible approximation errors do not always result in the best performance of LUT-based BP decoding.

Some embodiments of the invention are based on recognition that the incoming messages are not uniformly distributed, and that the probability distribution can change across the decoding iterations. For example, if the probability of $(L_1, L_2)=(-2A, -2A)$ is much smaller than the probability of $(L_1, L_2)=(0, 0)$ at which there is no approximation error, the overall performance may not be degraded significantly. Accordingly, some embodiments optimize the LUTs by taking the statistics of the belief messages into account so that the quantization level is kept small while the degradation is negligible.

In some embodiments, the metric for determining LUT is an increase of mutual information (MI) of the outgoing belief messages with values having the probability of incoming belief messages. Increasing the MI results in increases of the decoding performance because the belief messages are updated to increase the reliability over decoding iterations. Let $Q_0$, $Q_1$, and $Q_2$ be the quantization levels of the outgoing belief message $L_0$, the quantization levels of the first incoming belief message $L_1$, and the quantization levels of the second incoming belief message $L_2$, respectively. The $Q_i$-alphabet quantization points for $L_i$ are represented as $(V_i^1, V_i^2, \ldots, V_i^{Q_i})$, those of which occur with a probability of $(P_i^1, P_i^2, \ldots, P_i^{Q_i})$. The probability for such discrete event is called a probability mass function (PMF), which must be within a range between 0 and 1, and becomes 1 when being summed up, i.e., $\Sigma_{j=1}^{Q_i} P_i^j = 1$. For the above example of LUT, the 4-level quantization points are $(V_i^1, V_i^2, V_i^3, V_i^4) = (-2A, -A, 0, A)$. This quantization points are arbitrary, and adjusting the quantization points of incoming messages changes their own PMFs. Given the PMF of the first incoming message and the PMF of the second incoming message, the PMF of the outgoing message varies according to the LUT. For example, the above example of LUT for VND provides the value of $L_0 = V_0^4 = A$ for 3 pairs of incoming messages of $(L_1, L_2) = \{(V_1^3, V_2^4), (V_1^4, V_2^3), (V_1^4, V_2^4)\}$, and thus the probability of $L_0 = V_0^4$ is expressed as $P_0^1 = P_1^3 P_2^4 + P_1^4 P_2^3 + P_1^4 P_2^4$.

Likewise, the outgoing message of $L_0 = V_0^2 = 0$ occurs for three pairs of incoming messages of $(L_1, L_2) = \{(V_1^2, V_2^4), (V_1^3, V_2^3), (V_1^4, V_2^1)\}$, and the probability becomes $P_0^3 = P_1^2 P_2^4 + P_1^3 P_2^3 + P_1^4 P_2^2$. The PMF of incoming messages are usually non-uniform, and hence those probabilities can be different. In consequence, the different LUT results in different PMF of outgoing message. For example, the above example of LUT for CND outputs the value of $L_0 = V_0^3 = 0$ for all pairs of incoming messages except for the pair of $(L_1, L_2) = \{(V_1^1, V_2^1)\}$. Correspondingly, the PMF of outgoing message becomes $(P_0^1, P_0^2, P_0^3, P_0^4) = (0, 0, 1-P_1^1 P_2^1, P_1^1 P_2^1)$, which is different from another example of LUT for VND. The method of the invention uses the statistics, i.e., the PMFs, to provide efficient and accurate LUT for quantized BP decoding.

The PMFs of the incoming and outgoing messages depend on the associated bit of the codeword. More specifically, the PMF for the belief message $L_i$ is $(P_i^1[b], P_i^2[b], \ldots, P_i^{Q_i}[b])$ when the i-th bit of the codeword is b, where b comes from the set of Galois field, i.e., $b = \{0, 1, 2, \ldots, M-1\}$ for M-ary LDPC codes. If $M=2$, the LDPC codes are binary, and non-binary unless otherwise. The MI of the belief messages $L_i$ associated to the i-th bit of the codeword is analytically calculated as follows:

$$I_i = -\sum_{j=1}^{Q_i} \left( \overline{P}_i^j \log_M \overline{P}_i^j - \frac{1}{M} \sum_{b=0}^{M-1} P_i^j[b] \log_M P_i^j[b] \right),$$

where $\overline{P}_i^j$ is an averaged probability over M-ary alphabets, defined as follows:

$$\overline{P}_i^j = \frac{1}{M} \sum_{b=0}^{M-1} P_i^j[b].$$

For example, when SNR is high, the LLR data from the demodulator have usually higher amplitudes. For this case, the probability of $L_1=-2A$ is much higher than the probability of $L_1=0$ for the above example of 4-level quantization. In contrast, for low-SNR regimes, the probability of $L_1=0$ can be much higher than the others. The difference of the probabilities (i.e., PMFs) results in different MI of the outgoing belief messages and the LUT for one specific PMF is no longer optimal for the other PMFs of the incoming belief messages. Accordingly, different embodiments use multiple LUTs, which are adaptively selected based on the probability to deal with this problem.

For example, in one embodiment, the BP decoding uses at least two different LUTs for at least two different iterations, wherein the two different LUTs uses different quantized function modified with different probabilities that the belief messages represent the bits of the codeword to map identical values of the incoming belief messages to different values of the outgoing belief message. For example, the quantized function approximated by the LUTs is a log-likelihood function quantized to a predetermined set of values determined such that mutual information of the belief messages is increased depending on the probability of the belief messages. In some embodiments, the predetermined set of values changes between at least two iterations of the BP decoding.

Statistics of Belief Messages and Optimal Quantization

Some embodiments of the invention determine the LUTs for different probabilities of the belief messages. For example, one embodiment provides a way to design LUT database 140 to minimize the number of quantization levels while the degradation of the overall bit-error rate (BER) performance is negligible. The embodiment uses the LUT design method in favor of maximizing the MI of the output of LUTs rather than just minimizing the quantization errors. The adaptive LUT can work as a floating-point operation even with a limited precision, and the degradation due to dynamic range loss for different SNR can be resolved.

The statistics of the LLR data from the demodulator is well descried by a Gaussian mixture model (GMM) before quantization. For example of 4-ary QAM modulation format, the LLR distribution is given as follows:

$$Pr(L) = \frac{1}{2}\mathcal{N}\left(\frac{2}{S^2}, \frac{4}{S^2}\right) + \frac{1}{2}\mathcal{N}\left(-\frac{2}{S^2}, \frac{4}{S^2}\right),$$

where N(a,b) denotes the Gaussian distribution with a mean of a and a variance of b, and $S^2$ is an effective noise variance over the communication channel, i.e., the channel SNR is given by its inverse, $1/S^2$. The MI of the LLR is given by the ten-Brink's J-function, which is well approximated by a Marquardt-Levenberg method as follows:

$$J(s) = \begin{cases} -0.042s^3 + 0.209s^2 - 0.009s, & 0 < s < 1.636, \\ 1 - \exp(0.0018s^3 - 0.143s^2 - 0.0822s + 0.0549), & 1.636 < s < 10, \\ 1, & 10 < s, \end{cases}$$

where $s=2/S^2$. This clearly shows the change of MI over different SNRs, $1/S^2$.

Moreover, the MI of the LLR from the demodulator also depends on the modulation formats. For example, the MI of some modulation formats can be well approximated by the following error function:

$$I \cong \tfrac{1}{2}\mathrm{erfc}(a_0 + a_1 s' + a_2 s'^2 + a_3 \exp(a_4 + a_5 s')),$$

where erfc(x) is a complementary error function, $s'=10 \log_{10}(1/S^2)$ is the SNR in dB, and the parameters $a_i$ vary for different modulation formats, e.g., ($a_0, a_1, a_2, a_3, a_4, a_5$)=(−0.427, −0.156, −0.0032, 0, 0, 0), for 2-ary QAM, ($a_0, a_1, a_2, a_3, a_4, a_5$)=(0.012, −0.137, −0.0031, 0, 0, 0), for 4-ary QAM, ($a_0, a_1, a_2, a_3, a_4, a_5$)=(0.549, −0.095, −0.0019, 0, 0, 0), for 16-ary QAM, and ($a_0, a_1, a_2, a_3, a_4, a_5$)=(0.426, −0.105, −0.0034, 0, 0, 0), for 8-ary QAM.

The above MI of the LLR data can be degraded by quantizing into finite-precision alphabet at the demodulator. The method of the invention provides the best quantization points for the LLR data to maximize the MI of the quantized LLR data. For example, when the quantization points are uniformly located as $$V_i^j = \left(j - \frac{Q_i - 1}{2}\right)A_i,$$

with a threshold factor of $A_i$, the optimal threshold is derived by the following expression:

$$A_i = \exp(c_0 + c_a s'),$$

where parameters $c_0$ and $c_1$ depend on the number of quantization points, e.g., as follows:

($c_0, c_1$)=(−0.565, −0.119), for 3-level quantization, ($c_0, c_1$)=(−0.096, −0.119), for 4-level quantization, and ($c_0, c_1$)=(−0.667, −0.120), for 8-level quantization.

Optimal quantization points to maximize the MI for different quantization level and other conditions can be found in a similar way with least-squares fitting. Using the optimized threshold, the MI of quantized LLR data is maximized, and the corresponding MI for 2-ary QAM is approximated by the error function with parameters:

($a_0, a_1, a_2, a_3, a_4, a_5$)=(0.556, −0.0743, −0.00057, −0.441, −0.0115, 0.128), for 3-level quantization, ($a_0, a_1, a_2, a_3, a_4, a_5$)=(0.508, −0.0764, −0.00061, −0.447, −0.0433, 0.128), for 4-level quantization, and ($a_0, a_1, a_2, a_3, a_4, a_5$)=(0.452, −0.0789, −0.00065, −0.388, 0.0595, 0.129), for 8-level quantization, respectively.

Now, different SNRs and modulation formats are related with the MI of quantized LLR data, which uses the best quantization points in one-to-one correspondence. In other words, given the MI value of the quantized LLR data, the PMF can be automatically derived by assuming that the non-quantized LLR data follows the above-mentioned GMM. More specifically, the PMF of quantized LLR data having the MI of I is calculated by integral of Gaussian distribution as follows:

$$P_i^j = \int_{\{|L_i - V_i^j| < |L_i - V_i^{k \neq j}|\}} Pr(L_i) dL_i.$$

Given the calculated PMF of incoming belief messages, one embodiment determines the LUT that results in increase of MI of outgoing belief message.

To that end, one embodiment determines the probability as a function of SNR. Additionally or alternatively, one embodiment determines the probability as a function of the SNR, the index of the iterations, the modulation format, and the quantization level.

Figure 4:
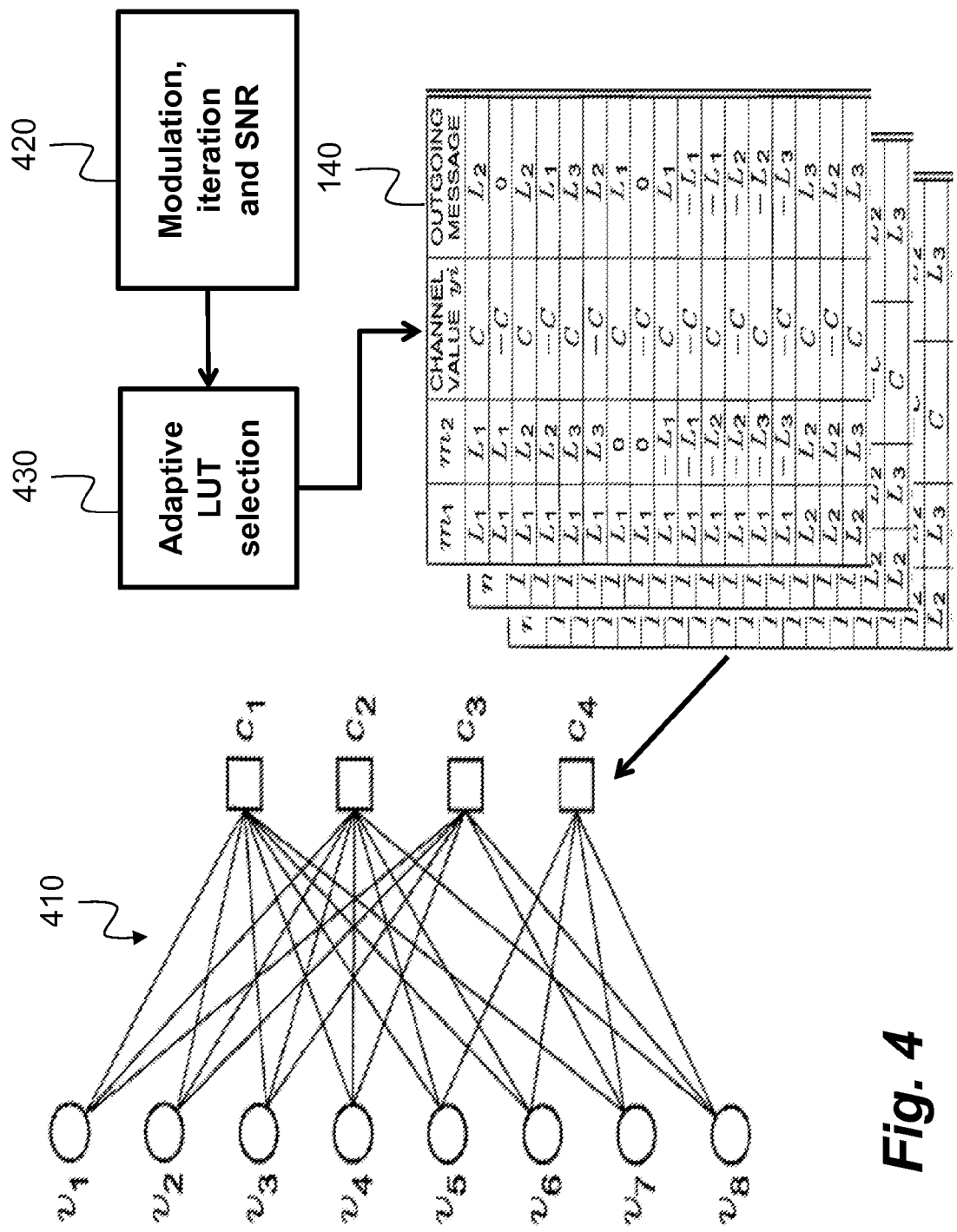
FIG. 4 is a schematic of adaptive selection of lookup tables for variable and check node decoders according to embodiments of the invention.
Figure 5:
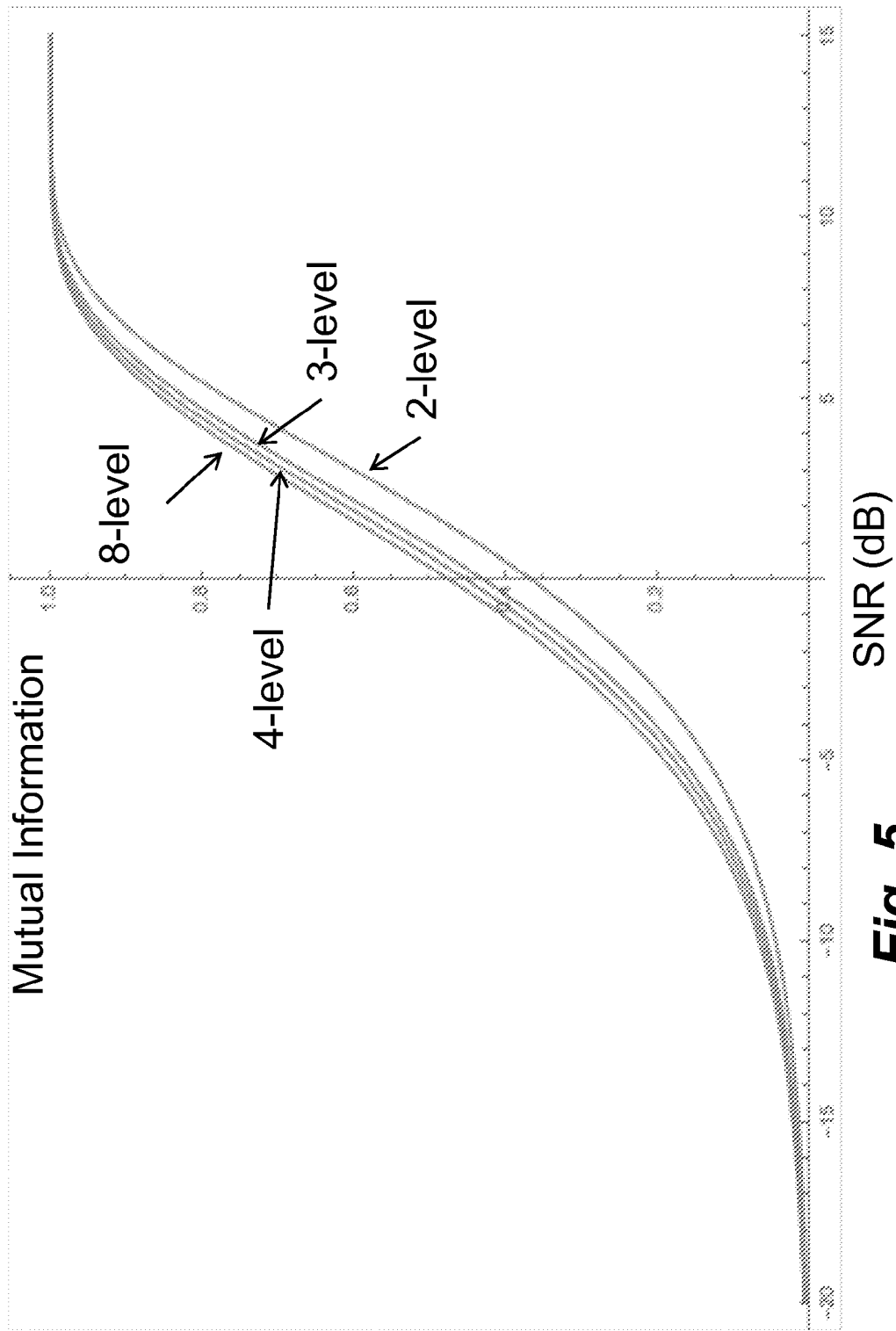
FIG. 5 is an example of mutual information of quantized belief messages with optimized quantization as a function of signal-to-noise ratio of channel according to some embodiments of the invention.

FIG. 4 shows a schematic of adaptive selection 430 of LUTs 140 for variable and check node decoders 410 depending on modulation format, quantization level, decoding iteration count, and/or SNR 420 according to embodiments of the invention. FIG. 5 shows an example of mutual information of quantized belief messages with optimized quantization as a function of signal-to-noise ratio of channel according to some embodiments of the invention. FIG. 5 shows the MIs for the above optimized 3-, 4-, and 8-level quantization. Compared to 2-level quantization, which corresponds to hard-decision belief messages, the optimized quantization provides more than 1 dB gain.

Global Optimization of LUT Adaptation and LDPC Code Designing

LUT adaptation is globally performed so that the final MI of belief messages is maximized after the finite-number of decoding iterations. The update behavior across decoding iterations can be analyzed by an extrinsic information transfer (EXIT) chart.

Figure 6:
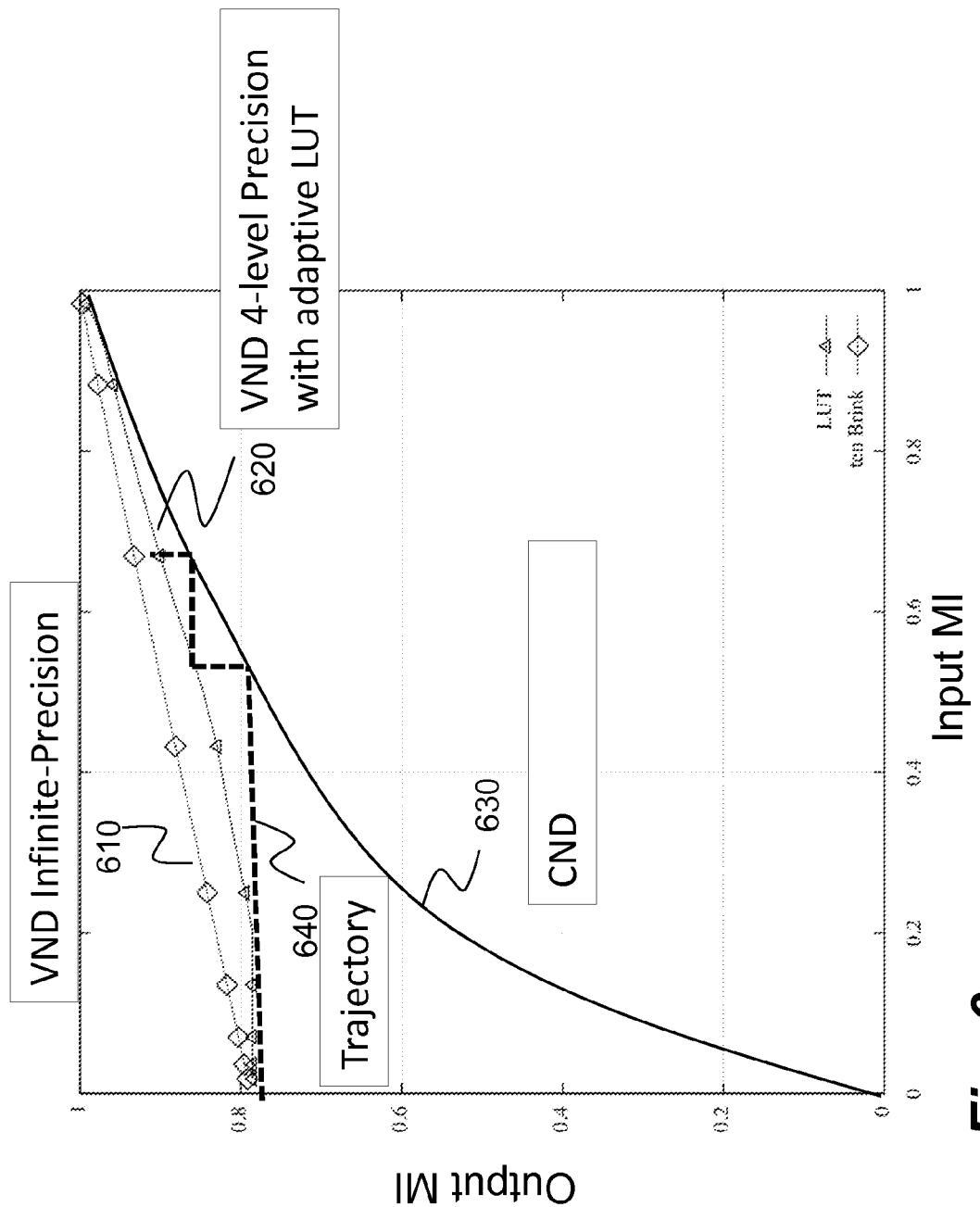
FIG. 6 is an example of EXIT chart used by some embodiments of the invention.

FIG. 6 shows examples of the EXIT chart, where VND curve 620 is present for adaptive 4-level LUT depending on PMFs of incoming belief messages. The EXIT chart shows the evolution of the updated belief messages in its MI over iterative decoding. Compared to infinite-precision VND curve 610, 4-level precision LUT with best adaptation has a marginal loss in output MI. By designed degree distribution for VND and CND using the EXIT curves for finite-precision and finite-iteration decoding, the embodiments of the invention can provide optimized parity-check matrix within little penalty from infinite-precision BP decoding. This penalty can be easily compensated by increasing the number of iterations in finite-precision BP decoding.

The belief messages from VND pass to CND, and the MI is improved. The evolution of the MI update can be analyzed by EXIT trajectory 640, which shows the final MI after 2-iteration decoding with the given CND curve 630, which can be adjusted by degree distribution design. In this embodiment, the code adaptation with different degree distribution provides further performance improvement according to LUT adaptation. This embodiment is based on a recognition that an optimized LDPC code for idealistic BP decoding is no longer optimal for finite-precision LUT-based decoding. In addition to optimizing the LDPC codes depending the adaptive LUT decoding, the method of the invention provides the way to select the best LUT for finite-iteration decoding by using this EXIT trajectory analysis. For example, the LUT which maximizes the outgoing MI at the first iteration is not always globally optimal after multiple iterations. The method globally selects the LUT which maximizes the final MI rather than intermediate MI of outgoing belief messages by finding best pairs of LUTs in EXIT trajectory.

In order to further improve the efficiency and accuracy within limited quantization levels, one embodiment uses a generalized node employing a vector quantization to represent multiple belief messages jointly. This embodiment is effective for generalized LDPC convolutional codes, which embed short block codes such as extended Golay codes as a high-dimensional modulation. One embodiment uses the generalized node to decode non-binary LDPC codes, in which LLR vector is jointly quantized by a vector quantization to maximize the MI. More specifically, the distribution of LLR vector for non-binary LDPC codes can be well approximated by a correlated GMM, whose covariance matrix has the maximum eigen-vector of all-ones vector, and the maximum eigen-value is M-times larger than other eigen-values. Using this statistical knowledge, one embodiment uses the best vector quantization to maximize the MI of the outgoing belief messages for non-binary LDPC codes. This is efficient because all quantized belief messages are now scalar values not vector values thanks to the vector quantization. Therefore, the computational complexity of non-binary LDPC decoding is significantly reduced by adaptive LUT decoding.

Accordingly, in one embodiment, the initial estimate of belief messages is quantized log-likelihood ratio (LLR) of the bits of the codeword encoded using a non-binary code. The embodiment represents jointly the two incoming belief messages as a generalized node for an LLR vector using a vector quantization and determines the LUT to increase the mutual information of the LLR vector. Additionally the embodiment can also determine LDPC codes for decoding the codeword by embedding short block codes according to the generalized node.

Decoder Scheduling

Figure 7A:
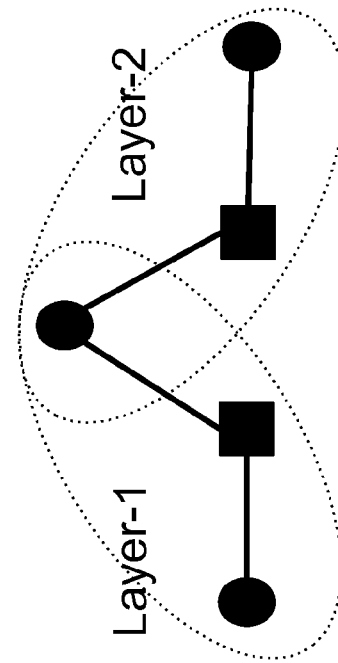
FIG. 7A is an example of parity-check matrix (PCM) divided by subsets of variable nodes and layers of check nodes according to some embodiments of the invention.
Figure 7B:
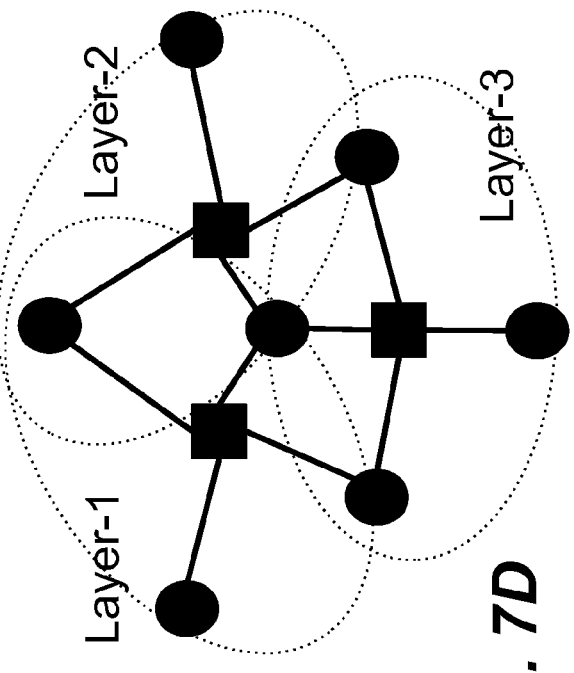
FIG. 7B is a protograph for the PCM of FIG. 7A.

In one embodiment, the LUT updates allow any scheduling such as flooding, shuffled, and layered scheduling. One embodiment takes the scheduling into account to modify the EXIT trajectory analysis for LUT design. For example, when the 2-layer scheduling is employed, the PCM can be divided by 3 subsets of variable nodes and 2 layers of check nodes as shown in FIG. 7A. The first subset of variable nodes is connected with only the first layer of check nodes, the second subset of the variable nodes is connected with both the layers of check nodes, and the last subset of the variable nodes is connected with only the second layer of check nodes. This topology can be represented by a protograph shown in FIG. 7B. The second subset of variable nodes plays an important role to propagate the belief messages between the first layer and the second layer decoding. The contribution of such nodes into the MI update can be characterized by a fraction of the number of edges connecting to the second variable nodes. The method of the invention provides the way to analyze the EXIT chart for any scheduling to design LUT. For example, when the average variable degree is d, the fraction of the first subset of variable nodes is given by a binomial distribution of $f_1=\frac{1}{2}^d$, and the fraction of the second subset of variable nodes is $f_2=1-\frac{1}{2}^{d-1}$.

Figure 7C:
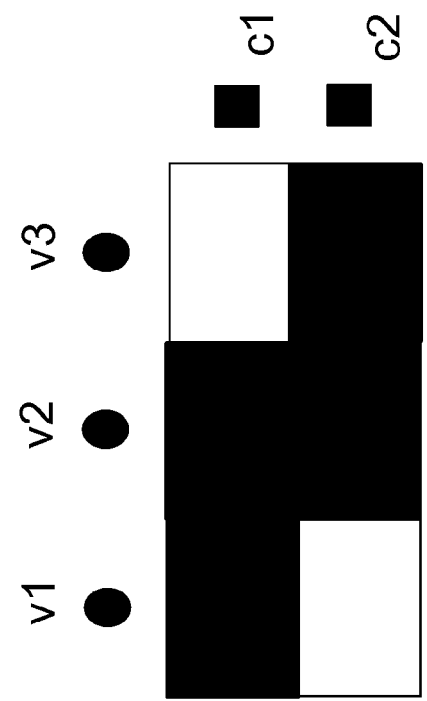
FIG. 7C is graphs of modified EXIT trajectories in dependence on the scheduling according to the embodiment of the invention.

FIG. 7C shows a modified EXIT trajectory analysis depending on scheduling according to the embodiment of the invention. The first layer decoding provides the updated MI of ordinary EXIT curve, multiplied by the fractions. For example, the MI update for CND per layer is contributed by a half, and the MI update of VND per layer is contributed by $(f_1+f_2)$. The result of the MI update can be higher than the ordinary EXIT curve, leading to faster convergence to error-free MI, which is at the top-right corner of the EXIT chart. When the average degree is large enough, the layered scheduling provides approximately twice faster speed of decoding convergence.

Figure 7D:
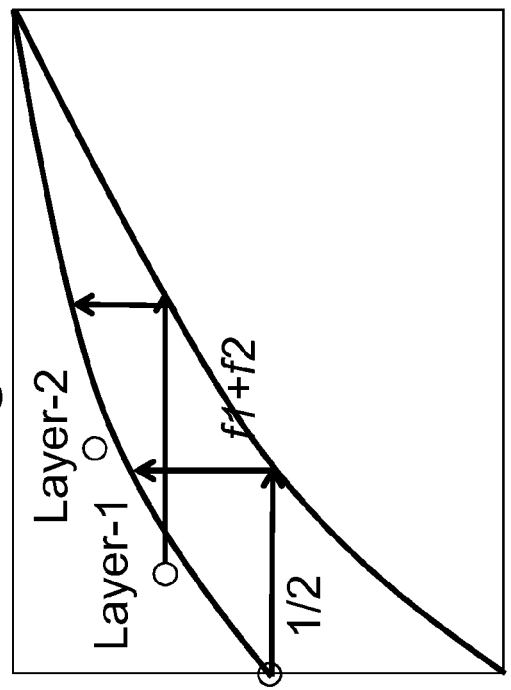
FIG. 7D is a protograph for 3-layer scheduling with seven different subsets of variable nodes and three layers of check nodes according to the embodiment of the invention.

The above-mentioned EXIT trajectory analysis can be generalized for any scheduling in a straightforward manner by using a protograph and protograph-based EXIT chart. For example, when 3-layer scheduling is employed, the protograph is represented by FIG. 7D, where there are 7 different subsets of variable nodes and 3 layer of check nodes. To further improve the performance, the LUT is designed to maximize the MI depending on scheduling, and then the scheduling is re-arranged given the re-designed LUT so that scheduling and LUT are jointly optimized.

The above-described embodiments of the present invention can be implemented in any of numerous ways. For example, the embodiments can be implemented using hardware, software or a combination thereof. When implemented in software, the software code can be executed on any suitable processor or collection of processors, whether provided in a single computer or distributed among multiple computers. Such processors can be implemented as integrated circuits, with one or more processors in an integrated circuit component. Though, a processor can be implemented using circuitry in any suitable format.

Also, the various methods or processes outlined herein can be coded as software that is executable on one or more processors that employ any one of a variety of operating systems or platforms. Also, the embodiments of the invention can be embodied as a method, of which an example has been provided. The acts performed as part of the method can be ordered in any suitable way. Accordingly, embodiments can be constructed in which acts are performed in an order different than illustrated, which can include performing some acts concurrently, even though shown as sequential acts in illustrative embodiments.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

We claim:

1. A method for decoding a codeword transmitted over a channel, comprising:
   demodulating data received over the channel to produce an initial estimate of belief messages for bits of the codeword; and
   decoding the codeword using a belief propagation (BP) decoding that iteratively passes the belief messages between a set of variable nodes representing the bits of the codeword and a set of check nodes representing parity-check constraints on the bits of the codeword until a termination condition is met, wherein the BP decoding comprises:
   determining a probability of the belief messages;
   selecting a look-up table (LUT) from a set of LUTs based on the probability; and
   mapping, using the LUT, values of at least two incoming belief messages to values of at least one outgoing belief message that forms an incoming belief message in a subsequent iteration of the BP decoding, wherein at least some steps of the method are performed by a processor of a BP decoder.

2. The method of claim 1, wherein values of the belief messages are quantized, and wherein each LUT maps the quantized values of the two incoming belief messages to the quantized values of the outgoing belief messages according to a quantized function of the incoming belief messages modified based on the probability.

3. The method of claim 2, wherein the probability is a probability mass function (PMF) that gives the probability of occurrence of the quantized values of belief messages conditioned on the bits of the codeword.

4. The method of claim 3, further comprising:
   selecting a set of PMF for the belief messages of the BP decoding; and
   determining, for each PMF, a LUT that increases mutual information (MI) of the outgoing belief messages with values having a probability governed by the PMF to form the set of LUTs.

5. The method of claim 2, wherein the BP decoding uses at least two different LUTs for at least two different iterations, wherein the two different LUTs uses different quantized function modified with different probabilities that the belief messages represent the bits of the codeword to map identical values of the incoming belief messages to different values of the outgoing belief message.

6. The method of claim 2, wherein the quantized function is a log-likelihood function quantized to a predetermined set of values determined such that mutual information of the belief messages is increased depending on the probability of the belief messages, wherein the predetermined set of values changes between at least two iterations of the BP decoding.

7. The method of claim 1, further comprising:
   determining a signal-to-noise ratio (SNR) in the channel; and
   determining the probability as a function of the SNR.

8. The method of claim 7, further comprising:
   determining an index of the iterations of the BP decoding; and
   determining the probability as a function of the SNR, the index of the iterations, and a modulation format.

9. The method of claim 1, wherein the BF decoder is a cascading decoder that uses multiple stages for propagating the belief messages, further comprising:
   selecting at least two different LUTs for at least two different stages of the cascading decoder, wherein the LUT for different stages of the cascading decoder have a predetermined level of quantization.

10. The method of claim 1, further comprising:
    determining the LUT associated with the probability of the belief messages, such that at least two incoming belief messages representing the bits of the codeword with the probability are mapped by the LUT to at least one outgoing belief message that increases mutual information of the incoming belief messages.

11. The method of claim 10, wherein the initial estimate of belief messages is quantized log-likelihood ratio (LLR) of the bits of the codeword encoded using a non-binary code, further comprising:
    representing jointly the two incoming belief messages as a generalized node for an LLR vector using a vector quantization; and
    determining the LUT to increase the mutual information of the LLR vector.

12. The method of claim 11, further comprising:
    determining low-density parity-check (LDPC) codes for decoding the codeword by embedding short block codes according to the generalized node.

13. The method of claim 1, further comprising:
    determining a low-density parity-check (LDPC) code for the variable nodes and the check nodes with variable degree distribution;
    determining the LUTs adapted for the variable degree distribution of the variable nodes and the check nodes; and
    determining a scheduling of BP decoding such that mutual information of the belief messages after predefined number of iterations is increased.

14. A system for decoding a codeword transmitted over a channel, comprising:
    a demodulator to demodulate data received over the channel and to produce an initial estimate of belief messages for bits of the codeword;
    a memory to store a set of look-up tables (LUTs) determined for different probabilities of the belief messages;
    a belief propagation (BP) decoder to decode the codeword by iteratively passing the belief messages between a set of variable nodes representing the bits of the codeword and a set of check nodes representing parity-check constraints on the bits of the codeword until a termination condition is met, wherein the BP decoder
    determines a probability of the belief messages to represent the bits of the codeword;
    selects, based on the probability, a LUT from the set of LUTs stored in the memory; and
    maps, using the LUT, values of at least two incoming belief messages to values of at least one outgoing belief message that forms an incoming belief message in a subsequent iteration of the BP decoder.

15. The system of claim 14, wherein values of the belief messages are quantized, and wherein each LUT maps the quantized values of the two incoming belief messages to the quantized value of the outgoing belief message according to a quantized function of the incoming belief messages modified based on the probability, and wherein the probability is a probability mass function (PMF) that gives the probability that the quantized value of belief messages occurs conditioned on the bits of the codeword.

16. The system of claim 15, wherein the BP decoder determines the probability as a function of a signal-to-noise ratio (SNR) in the channel.

17. The system of claim 15, wherein the BP decoder determines the probability as a function of a signal-to-noise ratio (SNR) in the channel and an index of the iterations of the BP decoding.

18. The system of claim 14, wherein the BP decoder determines a scheduling to propagate the belief messages, wherein a subset of the variable nodes and a subset of the check nodes propagates belief messages in parallel, wherein the subsets change for different iterations, wherein the scheduling is determined such that mutual information of the propagated belief messages is increased after predefined number of iterations.

* * * * *